(12) United States Patent
Kaiser et al.

(10) Patent No.: US 6,449,206 B2
(45) Date of Patent: Sep. 10, 2002

(54) SEMICONDUCTOR CIRCUIT CONFIGURATION

(75) Inventors: Robert Kaiser, Kaufering; Jürgen Lindolf, Friedberg; Thilo Schaffroth, Röhrmoos; Florian Schamberger, Bad Reichenhall; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/867,292

(22) Filed: May 29, 2001

(30) Foreign Application Priority Data

May 26, 2000 (DE) .......................................... 100 26 276

(51) Int. Cl.⁷ ................................................ G11C 8/00
(52) U.S. Cl. ...................................... 365/225.7; 365/63
(58) Field of Search ................................ 365/225.7, 63

(56) References Cited

U.S. PATENT DOCUMENTS 4,887,241 A 12/1989 Tran ....................... 365/230.06

6,199,025 B1 * 3/2001 Fujii ........................ 365/225.7

FOREIGN PATENT DOCUMENTS

| JP | 58-108099 A | * | 6/1983 | ........... G11C/29/00 |
| JP | 61-17299 A | * | 1/1986 | ........... G11C/29/00 |

OTHER PUBLICATIONS

Betty Prince, "Semiconductor Memories", 1983, Wiley, 2$^{nd}$ edition p. 526.*

* cited by examiner

Primary Examiner—M. Tran
(74) Attorney, Agent, or Firm—Laurence A. Greenberg; Werner H. Stemer; Gregory L. Mayback

(57) ABSTRACT

In order to program a programmable element, it is proposed in a semiconductor circuit configuration to connect a first and a second connecting terminal of a programmable element to first and/or second potential devices provided in the semiconductor circuit configuration. In this manner, the first and second potentials are intrinsically made available to form a burning voltage for programming the programmable element.

15 Claims, 1 Drawing Sheet

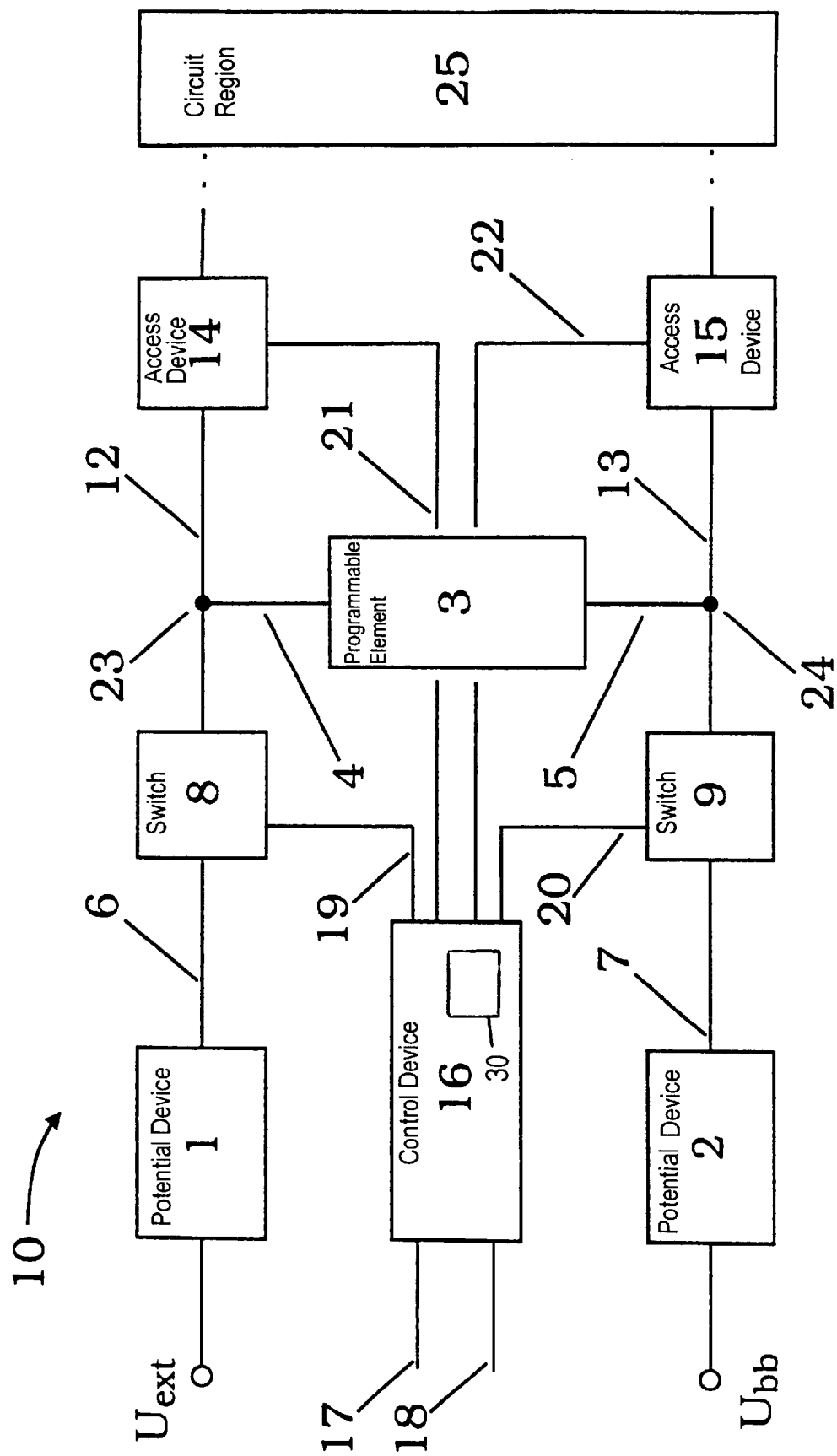

SEMICONDUCTOR CIRCUIT CONFIGURATION

BACKGROUND OF THE INVENTION

FIELD OF THE INVENTION

The invention relates to a semiconductor circuit configuration. The semiconductor circuit configuration contains at least one first potential device for making available a first potential and at least one second potential device for making available a second potential. At least one programmable element having a first connecting terminal and a second connecting terminal is provided. The programmable element has an electrical state, in particular its ohmic resistance, able to be permanently varied by applying between the first connecting terminal and the second connecting terminal a potential difference having a value reaching a burning voltage predefined for the programmable element. A first electrical connecting device is connected in a conductive manner between the first connecting terminal of the programmable element and the first potential device. A second electrical connecting device is connected in a conductive manner between the second connecting terminal of the programmable element and the second potential device.

Semiconductor circuit configurations, in particular semiconductor modules, chips, integrated circuits, semiconductor memories or the like often have electrically programmable elements whose electrical properties can be varied permanently by applying to them a potential difference which exceeds a given burning voltage.

Such electrically programmable elements, which are also referred to as electrical fuses, are used for trimming and/or repair purposes in semiconductor circuit configurations when redundant repair circuits are used.

All these applications have in common the fact that the electrical parameters of the electrically programmable element are permanently changed on the basis of specific decision criteria by applying a corresponding voltage, that as a result, for example, specific additional component circuit configurations or even individual assemblies are switched on and off in a defined fashion. There is thus provision in an application, for example in semiconductor memories, that, for example, defective memory cells or memory locations are permanently switched off and permanently replaced by operationally capable standby regions.

In conventional semiconductor circuit configurations with corresponding, electrically programmable elements, the relatively high burning voltage which is necessary to program the electrically programmable elements and which lies far above the internal operating voltage of the semiconductor circuit configuration can be implemented only at relatively high cost in the vicinity of the semiconductor circuit configuration. Furthermore, in order to implement rapid programming with short programming times, a particularly highly charged voltage network is necessary, which would make additional capacitances for supporting and supplying the burning current necessary, which is a measure which decreases the area utilization rate in conventional circuit configurations.

In order to avoid these problems, it has been proposed in the prior art to carry out, an additional burning process even, in effect, after the production process for the semiconductor circuit configuration, in which burning process an appropriate burning voltage is made available from the outside for a brief time period, if appropriate by corresponding additional burning terminals.

One problem with this procedure is that there is no provision for conventional semiconductor circuit configurations to have an external and increased burning voltage applied to them, in particular during the additional, subsequent burning process. Various manufacturers even explicitly advise against subsequent application of high voltages within the scope of specific burning processes in order to avoid damage to other elements of the semiconductor circuit configuration which are not at all configured to receive increased burning voltages.

SUMMARY OF THE INVENTION

It is accordingly an object of the invention to provide a semiconductor circuit configuration that overcomes the above-mentioned disadvantages of the prior art devices of this general type, in which electrically programmable elements which are provided in it can be programmed in a way which is particularly simple and reliable and which does not place stresses on the rest of the semiconductor circuit configuration.

With the foregoing and other objects in view there is provided, in accordance with the invention, a semiconductor circuit configuration. The semiconductor circuit configuration contains at least one first potential device for making available a first potential, at least one second potential device for making available a second potential, and at least one programmable element having a first connecting terminal and a second connecting terminal. The programmable element has an electrical state able to be permanently varied by applying between the first connecting terminal and the second connecting terminal a potential difference having a value reaching a burning voltage predefined for the programmable element. A first electrical connecting device is connected between the programmable element and the first potential device, the first electrical connecting device providing a conductive connection between the first connecting terminal of the programmable device and the first potential device. A second electrical connecting device is connected between the programmable element and the second potential device, the second electrical connecting device providing a conductive connection between the second connecting terminal of the programmable device and the second potential device. A circuit region and controllable switching devices are provided. The switches include a first switching device connected between the circuit region and the first connecting terminal and a second switching device connected between the circuit region and the second connecting terminal. The controllable switching devices disconnecting in a controllable manner an electrical state of the programmable element from the circuit region during a burning operation.

In the semiconductor circuit configuration of the generic type, in particular a semiconductor module, chip or the like, at least one first potential device is provided which is configured at least for making available a first potential, in particular for generally and/or externally supplying a voltage to the semiconductor circuit configuration. Furthermore, at least one second potential device is provided which is configured at least for making available a second potential, in particular for the general and/or negative bias voltage of at least one substrate region of the semiconductor circuit configuration. In addition, the semiconductor circuit configuration of the generic type has at least one programmable element which has at least a first and a second connecting terminal and which is configured in such a way that its electrical state, in particular its ohmic resistance, between the first and second connecting terminals can be varied permanently by applying a potential difference between the connecting terminals whose value at least reaches a burning voltage predefined for the programmable element.

The semiconductor circuit configuration according to the invention is defined by the fact that the first electrical connecting device is provided by which the first connecting terminal of the programmable element can be connected in a conductive fashion to the first potential device, and in that a second electrical connecting device is provided by which the second connecting terminal of the programmable element can be connected in a conductive fashion to the second potential device.

The semiconductor circuit configuration according to the invention thus makes it possible for potentials which have already been generated and are necessary for the basic operation of the semiconductor circuit configuration to be applied in each case to each of the two connecting regions of a programmable element. These measures obviate the need to provide an additional increased, external burning voltage and corresponding terminals for programming the programmable element, especially since the internal operating potentials which are provided are suitable, in combination, for forming a potential difference at the two connecting terminals of the programmable element. The difference permits the programmable element to be programmed and thus the electrical state of the electrical element to be reconfigured, in particular by virtue of the fact that the superposition or combination of the internal operating potentials leads to a potential difference that at least reaches the burning voltage.

Thus, in particular the first electrical potential may be what is referred to as the supply or operating voltage Uext which usually assumes, for example, values between 2.5 V and 3.3 V. The voltage Uext is absolutely necessary for operation and is made available from the outside, for example.

The second internal potential is in particular what is referred to as the bulk voltage Ubb for the negative bias voltage of at least one region of the semiconductor substrate, for example what is referred to as the p-type well region of a cell field of a semiconductor memory. The bulk voltage usually has values between 0 V and −1 V.

By virtue of the superposition of Uext and Ubb it is possible to dispense with the provision of an additional external, increased burning voltage and its connection to the programmable element. Furthermore, this also has the advantage of a burning process which is risk-free for the rest of the circuit because the semiconductor circuit configuration as a whole is basically already configured in such a way that it withstands the external operating voltage Uext, the bulk voltage Ubb and its superposition. Particular protective measures, for example insulation against high voltage, are therefore not necessary.

The programmable element is advantageously embodied in each case as a reversible or irreversible electrical fuse and/or antifuse or the like. This ensures that the electrically programmable element can be used in each case to implement switching on or off, it being possible in the reversible embodiment to switch back and forth between the switched-on and switched-off states.

Irreversible programmable elements are defined by the fact that their electrical state can be changed once irrevocably by applying a potential difference lying above the burning voltage. Thus, for example when a fuse switches, the transition from a conductive state to a non-conductive state is forced, for example by burning through a conductor sector owing to the high burning current corresponding to the burning voltage. On the other hand, in the case of an anti-fuse, the transition from a non-conductive state to a conductive state is forced, for example as a result of the fact that an insulating metal oxide layer is punctured with a burning current which corresponds to the high burning voltage, and a conductive connection is thus created.

Depending on the embodiment of the semiconductor circuit configuration, the first and second potential devices can each be embodied as a generator device for internally generating the respective potential and/or as a feed device for feeding the respective potential, in particular from the outside. Thus, for example the operating voltage Uext that is necessary to operate the semiconductor circuit configuration is usually made available as an external operating voltage from the outside via corresponding terminals. The corresponding first potential device would accordingly then be configured as a feed device in order, if appropriate, to feed the external operating voltage to the first connecting terminal of the programmable element. What is referred to as the bulk voltage can also be made available externally, if appropriate for example, as an inverted fraction of the external operating voltage Uext—or else can be generated explicitly in the semiconductor circuit configuration itself from the external operating voltage Uext. In the simplest case, the potential devices are each composed of a circuit that feeds the respective potential, in particular simply of one line.

In one particularly advantageous embodiment of the semiconductor circuit configuration according to the invention there is provision for the semiconductor circuit configuration and/or the first potential device to be embodied in such a way that the first potential Uext can be raised—in particular directly by the first potential device. Therefore, the semiconductor circuit configuration overall is to be configured in such a way that an increase in the externally fed operating voltage within certain limits should not lead to damage to the semiconductor circuit configuration. Second, the intention is also that the raising of the first potential should be capable of being generated externally or in fact even internally by the semiconductor circuit configuration and in particular by the first potential device itself. Raising the first potential which is to be applied to the first connecting terminal of the programmable element makes it possible to reach and/or exceed the burning voltage which is necessary for a burning operation or a programming operation in a particularly simple way.

Furthermore, according to a further preferred embodiment of the semiconductor circuit configuration according to the invention there is provision, in order to attain this object, for the semiconductor circuit configuration and/or the second potential device to be embodied in such a way that the second potential can be reduced—in particular directly by the second potential device. First, this is intended to signify that when a second potential that is made available from the outside is reduced, neither the semiconductor circuit configuration in its entirety nor the first potential device suffers damage. Second, this is intended to signify that the further reduction in the second potential can be implemented externally or in particular even internally by the semiconductor circuit configuration, and in that case in particular by the second potential device. The burning voltage that is necessary for programming the programmable element is also in this way reached and/or exceeded in a particularly simple way.

In a further preferred embodiment of the semiconductor circuit configuration according to the invention, the latter, the first potential device and/or the second potential device are embodied in such a way that the first and/or second potentials can be temporarily raised and/or reduced for a burning operation. This ensures that the energy necessary for reducing or raising the respective potentials has to be provided only temporarily by the corresponding devices and configurations. Furthermore, the sensitive elements of the semiconductor circuit configuration are prevented from being subjected to unnecessary electrical loading. Furthermore, it is possible, for example by suitable selection of the first and second potentials, to ensure that their superposition initially does not permit the burning voltage to be exceeded in any case other than at the time when the first potential is raised and/or the second potential is reduced for the temporary burning operation. This measure contributes to avoiding an unintentional burning operation.

As has already been described above, it is necessary, in particular in order to achieve short programming times, for the burning voltage that is to be applied to be obtained from a stable voltage network. For this reason, in the prior art additional capacitors or capacitances on the semiconductor circuit configuration are provided for stabilizing and smoothing. On the other hand, in one advantageous embodiment of the semiconductor circuit configuration according to the invention the capacitances that are present in any case in certain boundary layers between semiconductor substrate regions are used to stabilize the voltage network, in particular namely the capacitance between an insulated p-type well and a buried n-type well, the capacitance having in particular a value of approximately 50 nF or the like.

Advantageously, to control the burning operation of a respective programmable element a control device is provided which is configured to select the element which is to be programmed, if appropriate from a multiplicity of elements, and/or to control the raising/reduction of the first/second potential. This measure ensures that even when there is a multiplicity of programmable elements in the semiconductor circuit configuration the respective correct application of a corresponding burning voltage to the respective element intended for programming is carried out. The time sequence and/or the values of the raising and/or reduction of the potentials in order to reach or exceed the burning voltage can also be controlled by the control device provided.

In this context, when there is a multiplicity of programmable elements provided in the semiconductor circuit configuration, the control device has a shift register device which is preferably formed by which the element that is to be programmed can be selected in coded form. For this purpose, the control device can furthermore have an external control line and, if appropriate, a corresponding data line for conveying the respective addresses of the elements.

It is also advantageous that switching devices are provided by which the first and/or second potentials can be connected to the first and/or second connecting terminals of the respective programmable element, in which case the switching devices can each also be controlled by the control device. The basic idea of this measure is that the potentials which are superposed to form the burning voltage are to be applied to the connecting terminals or regions of the respective programmable element only if a burning operation is actually desired and/or if the respective programmable element has actually been selected for a burning operation.

The simultaneous provision of the control device, if appropriate with the shift register, and the switching devices for disconnecting the connecting regions of the respective programmable elements from the first and second potentials ensures a reliable and two-fold selection of the element which is to be programmed.

Here, the first selection is carried out by the control device, if appropriate by the shift register. The first selection implements the basic possibility of burning the respective programmable element. In a further step, it is then decided by the switching devices whether the burning operation will actually also be carried out.

If the superposition of the potentials that have not been raised or lowered has not yet reached the necessary burning voltage, there is even a third form of selection. Then, specifically, in order to actually carry out the programming or the burning of an element it is also necessary to implement a change in the potentials in order to reach or exceed the burning voltage with the superposition of the first and second potentials on the first and second connecting regions.

Basically, there is a permanent connection between part of the semiconductor circuit configuration and the programmable element. As a result, a tap is, as it were, continuously being carried out of the electrical state of the programmable element, at least by part of the semiconductor circuit configuration. At the time of the burning operation, the first or second potential is respectively applied, as has already been described in detail above, to the connecting regions. In order to avoid these potentials puncturing to the part of the semiconductor circuit configuration which taps the programmable element, in a further preferred embodiment of the semiconductor circuit according to the invention, controllable switching devices are provided by which a tap of the first and/or second connecting terminal—in particular of the electrical state—of the programmable element can be essentially disconnected by at least parts of the semiconductor circuit configuration—in particular in a controllable fashion by the control device during a burning operation.

Other features which are considered as characteristic for the invention are set forth in the appended claims.

Although the invention is illustrated and described herein as embodied in a semiconductor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single figure of the drawing is a schematic block diagram of an embodiment of a semiconductor circuit configuration according to the invention.

DESCRIPTION OF THE PREFERRED EMBODIMENTS

Referring now to the single figure of the drawing in detail, there is shown a schematic block diagram of an embodiment of a semiconductor circuit configuration 10 according to the invention.

A circuit region 25 of the semiconductor circuit configuration 10 according to the invention accesses connecting terminals or regions 4 and 5 of a programmable element 3 via access devices 12 and 13. The connecting terminals 4 and 5 of the programmable element 3 are, on the other hand, connected via nodes 23 and 24 and connecting devices 6 and 7 to potential devices 1 and 2 by which a first potential Uext and a second potential Ubb can be made available to the first connecting region 4 and/or to the second connecting region 5 of the programmable element 3.

The superposition of the first potential Uext and Ubb at the first terminal 4 and at the second terminal 5 of the programmable element 3 leads to a burning voltage Uburn which is necessary for the programming or burning operation of the programmable element 3 being exceeded. Because the first and second potentials must be made available continuously while the semiconductor circuit configuration 10 is operating, it is necessary to provide the application of the potentials to the first and second connecting regions 4 and 5 of the programmable element 3 exclusively at a well defined time, the burning time. For this purpose, a first switching device 8 is formed in the exemplary embodiment of the semiconductor configuration 10 according to the invention which is shown in the figure, in the connecting device 6 between the first connecting terminal 4 and the first potential device 1. On the other hand, a further switching device 9 is provided in the connecting device 7 between the second connecting terminal 5 of the programmable element 3 and the second potential device 2. The switching devices 8 and/or 9 are provided with control signals by a control device 16 which is provided, through control lines 19 and 20, the control signals closing the switching devices 8 and/or 9 at the burning time.

A contact is established between the first potential device 1 and the first connecting terminal 4 of the programmable element 3, and between the second potential device 2 and the second connecting terminal 5 of the programmable element 3 only if a corresponding control signal is output to the switching devices 8 and 9 via the control lines 19 and 20—specifically at the time when a burning operation is desired. In the absence of such a control signal, the connections between the potential devices 1, 2 and the connecting terminals 4, 5 are respectively disconnected.

On the other hand, it is continuously possible for the circuit region 25 of the semiconductor circuit configuration 10 according to the invention to access the first connecting terminal 4 and the second connecting terminal 5 via access lines 12 and 13, and thus access the electrical state of the programmable element 3, except at the time at which the control signals which disconnect the otherwise continuous conductive connection between the rest of the circuit configuration 25 and the first and second terminals 4 and 5, for example at the time when the burning operation is desired, are output to the access or switching devices 14 and 15 disposed in the access lines 12 and 13 via control lines 21 and 22 by the control device 16.

By use of this measure, a potential difference Ubb—Uext is applied to the programmable element 3, to its connecting terminals 4 and 5, precisely at the burning time, the remaining circuit region 25 of the semiconductor circuit configuration 10 according to the invention experiencing at the same time a disconnection from the burning voltage as a result of the disconnection by the switching devices 14 and 15 in the lines 12 and 13.

In order to control the burning operation, the control device 16 receives control signals via a control line 17 and a corresponding address signal via an address line 18 for the respective selection of the element 3 which is to be programmed. The control device 16 further a shift register 30 for identifying which programmable element 3 is to be subjected to a burning operation.

We claim:

1. A semiconductor circuit configuration, comprising:
at least one first potential device for making available a first potential;
at least one second potential device for making available a second potential;
at least one programmable element having a first connecting terminal and a second connecting terminal, said programmable element having an electrical state able to be permanently varied by applying between said first connecting terminal and said second connecting terminal a potential difference having a value reaching a burning voltage predefined for said programmable element;
a first electrical connecting device connected between said programmable element and said first potential device, said first electrical connecting device providing a conductive connection between said first connecting terminal of said programmable device and said first potential device;
a second electrical connecting device connected between said programmable element and said second potential device, said second electrical connecting device providing a conductive connection between said second connecting terminal of said programmable device and said second potential device;
a circuit region; and
controllable switching devices, including a first switching device connected between said circuit region and said first connecting terminal and a second switching device connected between said circuit region and said second connecting terminal, said controllable switching devices disconnecting in a controllable manner an electrical state of said programmable element from said circuit region during a burning operation.

2. The semiconductor circuit configuration according to claim 1, wherein said programmable element is selected from the group consisting of reversible electrical fuses, irreversible electrical fuses and anti-fuses.

3. The semiconductor circuit configuration according to claim 1, wherein said first potential device is embodied as at least one of a generator device for internally generating the first potential and as a feed device for feeding the first potential.

4. The semiconductor circuit configuration according to claim 1, wherein said first potential device receives and passes on the first potential from an external source to internal components, said first potential device further embodied to increase a potential level of the first potential received from the external source.

5. The semiconductor circuit configuration according to claim 4, wherein said second potential device receives and passes on the second potential from an further external source to the internal components, said second potential device embodied to decrease a potential level of the second potential.

6. The semiconductor circuit configuration according to claim 5, including a control device configured to select said programmable element, to select a time and a value in order to raise/reduce the first potential and the second potential for performing the burning operation of said programmable element.

7. The semiconductor circuit configuration according to claim 6, wherein said programmable element is one of a plurality of programmable elements, said control device has a shift register for selecting at least one of said programmable elements to be programmed.

8. The semiconductor circuit configuration according to claim 7, wherein:

said first electrical connecting device has a controllable switching device connected between said first potential device and said first connecting terminal, said control device connected to and controlling said controllable switching device of said first electrical connecting device for applying the first potential to said first connecting terminal of said programmable element; and said second electrical connecting device has a controllable switch connected between said second potential device and said second connection terminal, said control device connected to and controlling said controllable switching device of said second electrical connecting device for applying the second potential to said second connecting terminal of said programmable fuse.

9. The semiconductor circuit configuration according to claim 4, wherein the semiconductor circuit configuration receives and passes on the second potential from an further external source to the internal components, the semiconductor circuit configuration embodied to decrease a potential level of the second potential.

10. The semiconductor circuit configuration according to claim 1, wherein at least one of said first potential device and said second potential device is embodied such that the first potential and the second potential can be one of increased and decreased temporarily for assisting in performing the burning operation.

11. The semiconductor circuit configuration according to claim 1, including:

a semiconductor substrate having semiconductor substrate regions; and a capacitance connected in a region of a boundary layer of said semiconductor substrate regions for stabilizing the first potential, the second potential and the burning voltage which is to be applied.

12. The semiconductor circuit configuration according to claim 11, including:

insulated p-type well regions disposed in said semiconductor substrate; and buried n-type well regions disposed in said semiconductor substrate, said capacitance disposed between said insulated p-type well regions and said buried n-type well regions.

13. The semiconductor circuit configuration according to claim 1, where said electrical state is an ohmic resistance.

14. The semiconductor circuit configuration according to claim 1, wherein said second potential device is embodied as at least one of a generator device for internally generating the second potential and as a feed device for feeding the second potential.

15. The semiconductor circuit configuration according to claim 1, wherein the semiconductor circuit configuration receives and passes on the first potential from an external source to internal components, and the semiconductor circuit configuration is embodied to increase a potential level of the first potential.

* * * * *